US010911011B2

(12) United States Patent
Luk et al.

(10) Patent No.: US 10,911,011 B2
(45) Date of Patent: Feb. 2, 2021

(54) COHERENT OPTICAL MODEM WITH METHOD TO DISCOVER AND CONTROL AN AMPLIFIER'S AUTOMATIC GAIN CONTROL (AGC) LOOP BANDWIDTH

(71) Applicant: Ciena Corporation, Hanover, MD (US)

(72) Inventors: Tom Luk, Ottawa (CA); Michael Vitic, Québec (CA); Ron Hartman, Fitzroy Harbour (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/842,856

(22) Filed: Apr. 8, 2020

(65) Prior Publication Data

US 2020/0235713 A1    Jul. 23, 2020

Related U.S. Application Data

(63) Continuation of application No. 16/027,770, filed on Jul. 5, 2018, now Pat. No. 10,658,994.

(51) Int. Cl.
*H03G 3/30*    (2006.01)
*H03F 3/08*    (2006.01)
*H04B 10/61*    (2013.01)

(52) U.S. Cl.
CPC ............. *H03G 3/3084* (2013.01); *H03F 3/08* (2013.01); *H04B 10/61* (2013.01); *H03F 2200/129* (2013.01); *H03F 2200/471* (2013.01); *H03G 2201/103* (2013.01)

(58) Field of Classification Search
CPC .. H03G 3/3084; H03G 2201/103; H03F 3/08; H03F 2200/471; H03F 2200/129; H04B 10/61
See application file for complete search history.

(56) References Cited

U.S. PATENT DOCUMENTS

| 6,798,832 | B1 |   | 9/2004 | Nakata et al. |
| 7,471,229 | B2 | * | 12/2008 | Schofield ............. H03M 1/185 341/156 |
| 9,749,060 | B1 | * | 8/2017 | Wang ................. H04B 10/0731 |
| 2003/0207675 | A1 |   | 11/2003 | Hughes et al. |
| 2005/0089330 | A1 | * | 4/2005 | Grot ........................ H04J 14/02 398/139 |
| 2007/0126508 | A1 | * | 6/2007 | Montemayor ....... H03G 3/3052 330/284 |

OTHER PUBLICATIONS

Mostafa Ahmed "A 34 Gbaud Linear Transimpedance amplifier with Automatic gain control for 200Gb/s DP-16QAM optical coherent receivers", Elenion Technolgies LLC. (Year: 2018).*

* cited by examiner

*Primary Examiner* — Dhaval V Patel
(74) *Attorney, Agent, or Firm* — Clements Bernard Walker; Lawrence A. Baratta, Jr.; Christopher L. Bernard

(57) ABSTRACT

A coherent optical modem includes one or more inputs; one or more amplifier circuits, each coupled to a respective input of the one or more inputs; and one or more receiver circuits each including an analog-to-digital converter, each coupled to a respective amplifier circuit of the one or more amplifier circuits; wherein the one or more amplifier circuits are configured to implement an automatic gain control loop to provide a constant signal amplitude at an input of the analog-to-digital converter of a respective receiver circuit.

18 Claims, 5 Drawing Sheets

COHERENT OPTICAL MODEM WITH METHOD TO DISCOVER AND CONTROL AN AMPLIFIER'S AUTOMATIC GAIN CONTROL (AGC) LOOP BANDWIDTH

CROSS-REFERENCE TO RELATED APPLICATION(S)

The present disclosure is a continuation of U.S. patent application Ser. No. 16/027,770, filed Jul. 5, 2018, and entitled "Method to discover and control an amplifier's automatic gain control (AGC) loop bandwidth," the contents of which are incorporated by reference in their entirety.

BACKGROUND

Optical networks may transfer data over light waves. For example, a particular light wave may be generated at an optical transmitter and forwarded over an optical network to an optical receiver. Using an optical protocol, various light waves may be multiplexed using different frequency channels for transmission through the same transmission medium to various optical receivers. At the optical receivers, the light waves may be decoded into electrical signals.

An optical receiver may receive signals via an amplifier circuit that includes an integrated automatic gain control (AGC) loop. Automatic gain control is used in a receiver to vary gain in order to (1) maintain a constant output signal amplitude and (2) increase the dynamic range of the receiver. One approach to setting the loop bandwidth may be by using either an integrated or an external capacitance. Another approach may be implemented with a digital AGC loop that discovers and controls the AGC bandwidth.

SUMMARY

In general, in one aspect, embodiments relate to an amplifier circuit that may include: an amplifier configured to receive at least one input signal and generate an output voltage in response to the at least one input signal and a gain control voltage; a voltage detector configured to generate a detector voltage based on the output voltage; a gain control summation circuit configured to generate an error signal by subtracting the detector voltage from a reference voltage; a loop filter configured to generate the gain control voltage based on the error signal and adjust the loop bandwidth in response to a loop filter adjust signal; and an analog automatic gain control bandwidth controller configured to monitor the detector voltage and the gain control voltage, to provide the reference voltage and the loop filter adjust signal, and to control a loop bandwidth of the output signal.

In another aspect, embodiments relate to receiver circuit that may include: an analog-to-digital converter configured to receive an input signal from an amplifier of an amplifier circuit, a digital signal processor coupled to the analog-to-digital converter; a digital power detector configured to monitor digital power at the output of the analog-to-digital converter; firmware configured to communicate with the digital power detector and the amplifier circuit via a communication interface, wherein the firmware is configured to determine and set a reference voltage and a dither amplitude of an analog bandwidth controller integrated into the amplifier circuit based on at least the digital power monitored at the output of the analog-to-digital converter, wherein the reference voltage and dither tone are used to control an automatic gain control loop bandwidth of the amplifier circuit to obtain a constant signal amplitude at the input of the analog-to-digital converter.

In another aspect, embodiments relate to a method for discovering and controlling an automatic gain control loop bandwidth of an amplifier circuit. The method may include: monitoring a variation of an output peak detector voltage and an amplifier gain control voltage based on applying a dither tone to a reference voltage; computing a first gain slope of a voltage detector configured to detect an output voltage of an amplifier based on the variation; computing a second gain slope of a gain control of the amplifier based on the variation; computing the automatic gain control loop bandwidth using the first and second gain slopes; and controlling the automatic gain control loop bandwidth in response to a comparison of the computed automatic gain control loop bandwidth and a target bandwidth to provide a consistent amplifier output power within a predetermined tolerance.

Other aspects of the invention will be apparent from the following description and the appended claims.

BRIEF DESCRIPTION OF DRAWINGS

Specific embodiments of the invention will now be described in detail with reference to the accompanying figures. Like elements in the various figures are denoted by like reference numerals for consistency.

DETAILED DESCRIPTION

In the following detailed description of embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

One or more embodiments disclosed herein relates to monitoring and controlling an amplifier's automatic gain control (AGC) loop bandwidth in an integrated solution that is suitable for high-integration, pluggable coherent modems. Specifically, one or more embodiments of the present disclosure may include an analog AGC loop with loop bandwidth control.

AGC loop bandwidth may vary over temperature due to transimpedance amplifier (TIA) gain slope sensitivity and detector gain sensitivity. The TIA gain slope may vary about ±25% over its operating temperature range of approximately 70° C. In one or more embodiments, the AGC loop bandwidth may be controlled to within +10%. For example, the bandwidth may be 30 kHz±3 kHz.

Figure 1:
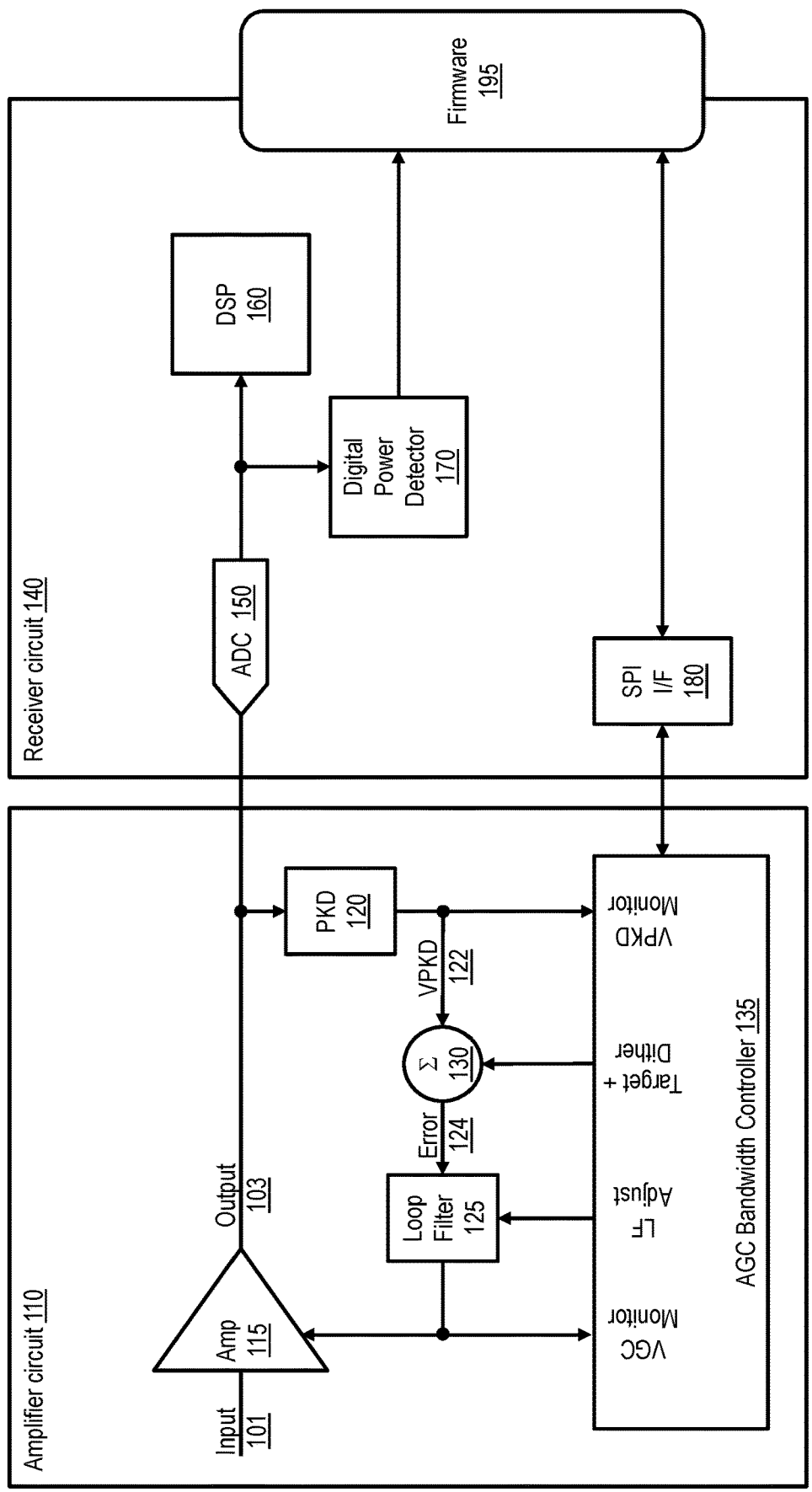
FIG. 1 presents a schematic of an amplifier circuit with automatic gain control bandwidth controller coupled to a receiver circuit in accordance with one or more embodiments of the present disclosure.

FIG. 1 presents a schematic of an amplifier circuit 110 coupled to a receiver circuit 140 in accordance with one or more embodiments of the present disclosure. In one or more embodiments, the amplifier circuit 110 may include an amplifier 115, an AGC bandwidth controller 135, a loop filter 125, a voltage detector 120, and a gain control voltage (VGC) summation circuit 130. The receiver circuit 140 may include a digital signal processor (DSP), a digital power detector 170 coupled to firmware 195 and a serial peripheral interface (SPI) 180. In one or more embodiments, the amplifier circuit 110 and the receiver circuit 140 may be integrated into a single circuit to provide a small form factor, or they may be two separate circuits as shown in FIG. 1. Each of these components of the circuits of FIG. 1 is described below in detail.

The amplifier circuit 110 may include an amplifier 115. The amplifier 115 is configured to receive an input signal 101 and a gain control voltage (VGC) 126 and generate an output signal 103. In one or more embodiments, the amplifier 115 may be a transimpedance amplifier that receives an electrical current as an input signal 101 and generates a voltage as output signal 103. For example, the amplifier circuit 110 may be part of an optical receiver system that is configured to receive optical signals transmitted over an optical fiber. The optical receiver system may be configured to convert the optical signal to an electrical photocurrent using a photodetector. The photocurrent may be used as an input signal to the amplifier 115. The amplifier may be operatively coupled to a voltage detector 120 and to an analog-to-digital converter (ADC) 150 in the receiver circuit 140.

The voltage detector 120 may be configured to monitor the output signal 103 of the amplifier 115 and generate a detected voltage 122. The voltage detector 120 may be a peak voltage detector (PKD) that outputs a peak detected voltage (VPKD) as seen in FIG. 1. In other embodiments, other voltage detectors may be used, for example, a root mean square (RMS) detector or an averaging detector. The voltage detector 120 may be monitored by an AGC bandwidth controller 135 and operatively coupled to a VGC summation circuit 130.

The VGC summation circuit 130 may add the voltages of a plurality of inputs and provides the sum as an output voltage. The VGC summation circuit 130 may be operatively coupled to the voltage detector 120, the AGC bandwidth controller 135, and the loop filter 125. The VGC summation circuit 130 may be configured to subtract detected voltage 122, e.g., peak detected voltage VPKD, from a reference voltage (VREF) 123 from the AGC bandwidth controller 135 and output the difference (VREF+(−VPKD)) as an error signal 124 to the loop filter 125. Thus, the AGC loop operates to drive the error signal 124 to zero, i.e., to VREF=VPKD.

The loop filter (LF) 125 may be used to control the loop bandwidth. The loop filter 125 may be operatively coupled to the VGC summation circuit 130, the AGC bandwidth controller 135, and the amplifier 115. The loop filter 125 may receive error signal 124 and a loop filter adjust signal from the AGC bandwidth controller 135 and generate gain control voltage 126.

The AGC bandwidth controller 135 may be operatively coupled to the SPI 180 of the receiver circuit 140. In one or more embodiments, the AGC bandwidth controller 135 may be analog. The AGC bandwidth controller 135 may be configured to monitor the detected voltage 122 of the amplifier 115 output voltage 103 via voltage detector 120, monitor the amplifier gain control voltage 126, generate a reference voltage 123, and adjust a loop filter characteristic when required. Loop filter characteristics that may be adjusted include loop filter bandwidth, time constant, gain, and the like.

The reference voltage 123 may be a target voltage. Details of determining the target voltage will be provided below. At other times, the reference voltage 123 may be the sum of the target voltage and a dither tone. The dither tone may be used to vary the reference voltage. Different waveforms may be used for the dither tone including square wave, sine wave, triangular wave, or any other suitable waveform. The reference voltage 123 may also be referred to as the output adjust (OA).

The ADC 150 of the receiver circuit 140 may receive analog voltage input 103 and convert it to a digital output. The ADC 150 may be operatively coupled to the amplifier 115 of the amplifier circuit 110 and to a DSP 160 and a digital power detector 170 of the receiver circuit 140.

The DSP 160 may be configured to receive a digital signal from the ADC 150. The DSP 160 may be a circuit configured to provide special processing of digital signals.

The digital power detector 170 may monitor the output signal of the ADC 150 and report the power output of the ADC 150 to the firmware 195.

The firmware 195 may be software, hardware, or a combination of software and hardware. The firmware 195 may be bidirectionally coupled to the SPI interface 180 and may communicate via the SPI interface 180 with the AGC bandwidth controller 135. Those skilled in the art will appreciate that while FIG. 1 shows an SPI interface, any suitable communication interface, serial or parallel, may be used to communicate between the firmware 195 and the AGC bandwidth controller 135.

In one or more embodiments, the receiver circuit 140 may be part of a multi-channel coherent optical receiver with e.g., four channels of input signal and one receiver circuit 140 per channel. Accordingly, in a multi-channel receiver, there may be a plurality of pairs of amplifier circuits 110 and receiver circuits 140 like those shown in FIG. 1. The purpose of controlling the AGC loop is to obtain a closely matched and consistent bandwidth across all channels of the receiver so that the coherent optical receiver is able to maintain a consistent input power into the ADC 150 across all channels. However, optical input signals may be subject power transients. For instance, 10 dB peak-to-peak power transients may be experienced. Accordingly, embodiments of the disclosure may maintain the input power to each ADC 150 to within ±0.2 dB peak-to-peak.

A coherent optical receiver's AGC loop may provide a constant signal amplitude at the input of the ADC 150. The latency and the bandwidth of the AGC loop may be configured so that the AGC loop can track optical power transients that appear in an optical link with a certain tolerable ADC fill error. For an ADC that is used to sample a time-varying signal, there may be an input RMS voltage and/or a peak-to-peak voltage that is optimum for the ADC clipping ratio of the time-varying signal receiver. The term ADC fill error is the difference between the actual RMS voltage at the ADC input and the optimum ADC input voltage. The error typically is expressed in dB. "Filling" the ADC may be understood to describe the RMS level at the input of the ADC.

In one or more embodiments, a single AGC bandwidth controller 135 might be used for control of a single channel. In other embodiments, a single AGC bandwidth controller 135 may control more than one channel, for example, all four channels of a coherent receiver. Those skilled in the art will appreciate that the bandwidth may be adjusted for all channels in parallel or serially, depending on how many AGC controllers are employed.

For a coherent optical receiver 140 that has a digital power detector 170 at the output of the ADC 150, the digital power detector 170 could provide features that simplify the design of the amplifier circuit's AGC bandwidth controller 135. By monitoring the digital power at the output of the ADC 150, firmware 195 for the receiver circuit 140 may determine and set the VREF target and dither amplitudes of the AGC bandwidth controller 135.

The AGC loop bandwidth may be selected based on a compromise between I-Q axis common-mode (CM) gain error and differential-mode (DM) gain imbalance. A wide loop bandwidth may reduce CM gain error but may raise DM gain imbalance. A narrow loop bandwidth may reduce DM gain imbalance but may raise CM gain error.

With a controlled AGC loop bandwidth, the signal-to-noise ratio (SNR) introduced by CM error and DM imbalance can drop from more than 36 dB to less than about 33-30 dB for an uncontrolled AGC loop bandwidth.

As an example, for a 32QAM application, a 0.2 dB DM gain imbalance introduces an SNR of 38 dB; a 0.4 dB DM gain imbalance introduces an SNR of 33 dB. The AGC loop bandwidth may be controlled such that a 0.25 dB_RMS DM gain imbalance is maintained.

By monitoring the variation of VPKD and VGC due to the dither tone on VREF, the gain slope of the peak detector (KPKD) and the gain slope of the amplifier (KGC) may be determined. By determining, or discovering, KPKD and KGC, the open loop gain of the AGC loop may be discovered. As an example, for an integrator-type loop filter, the 3 dB bandwidth of the AGC loop is given by Eqn. (1):

$$f_{3dB} = \frac{K_{GC} K_{PKD}}{2\pi\tau} \quad (1)$$

where $\tau$ is the integrator time constant, i.e., $\tau=RC$, the product of the resistance and the capacitance.

Having determined the $f_{3dB}$ of the AGC loop, the AGC bandwidth controller 135 may make adjustments to the loop filter characteristics for a target $f_{3dB}$. That is, by adjusting the loop filter time constant, either by adjusting R or C or both, the $f_{3dB}$ of the AGC loop may be tuned. Alternatively, in one or more embodiments, the AGC loop bandwidth may be adjusted in other ways. Recall that the loop bandwidth is determined by $$f_{3dB} = \frac{K_{GC} K_{PKD}}{2\pi\tau}$$

By inspection, the $f_{3dB}$ of the AGC loop may be tuned by changing one or more of these three parameters, $K_{GC}$, $K_{PKD}$ and/or $\tau$. That is, the AGC loop bandwidth may also be tuned by adjusting the gain of GC ($K_{GC}$) and/or the gain of PKD ($K_{PKD}$).

Figure 2:
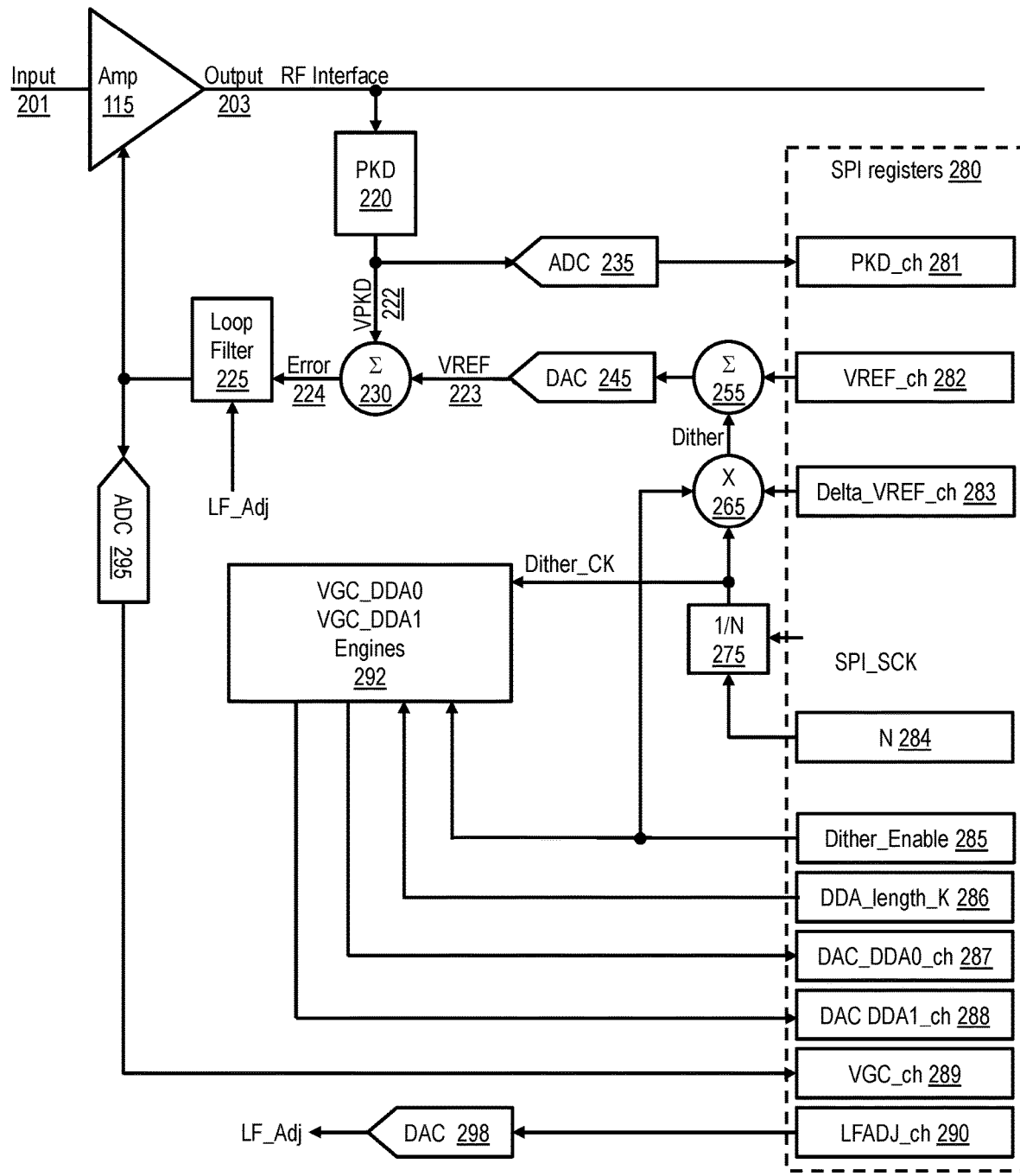
FIG. 2 presents a schematic of an amplifier circuit with automatic gain control bandwidth controller in accordance with one or more embodiments of the present disclosure.

FIG. 2 presents a more detailed schematic of an amplifier circuit 110 with an automatic gain control bandwidth controller 135 in accordance with one or more embodiments of the present disclosure. Features previously introduced in FIG. 1 and which have the same functionality will not be described in detail in FIG. 2 for purposes of readability.

By comparing FIG. 2 to FIG. 1, additional details of the AGC controller 135 are apparent. For example, AGC controller 135 may incorporate the functions of VPKD ADC 235, VGC ADC 295, and loop filter adjust (LFADJ) digital-to-analog converter (DAC) 298. Further, a 1/N divider circuit 275, a multiplier circuit 265, a dither summation circuit 255, and a VREF DAC 245 are also shown in FIG. 2. Further still, the VGC_DDA0 and VGC_DDA1 engines 292 may be included in an AGC controller 135. These features will be described in greater detail below.

Similar to FIG. 1, amplifier 215 may be configured to receive an input signal 201 and generate an output voltage 203. The output voltage 203 may be monitored by a voltage detector 220. In the embodiment shown in FIG. 2, the voltage detector is a peak voltage detector PKD 220. Other types of voltage detectors may also be used. The peak voltage detector 220 may be configured to generate peak detected voltage VPKD 222. The peak voltage detector 220 may be operatively coupled to VPKD ADC 235 and VGC summation circuit 230.

VGC summation circuit 230 may be configured to take the difference of two inputs and generate an error signal 224. The VGC summation circuit 230 may be operatively coupled to receive inputs from PKD 220 and VREF DAC 245 and to provide error signal 224 to loop filter 225.

Loop filter 225 may be configured to receive error signal 224 from VGC summation circuit 230 and a loop filter adjust (LF_Adj) signal from LFADJ DAC 298. The loop filter 225 may further be configure to output VGC 226 to amplifier 215 and to VGC ADC 295.

The amplifier gain control voltage VGC 226 may be monitored by providing the VGC ADC 295 output to VGC_ch 289. The peak voltage (or other voltages like RMS voltage or averaging voltage) may be monitored via VPKD ADC 235 and PKD_ch 281.

VGC ADC 295 monitors the analog VGC 226 and converts VGC into a digital signal. VGC ADC 295 may be operatively coupled to SPI register VGC_ch 289, allowing a measured value of VGC 226 to be communicated to the firmware 195. Herein, the suffix "ch" refers to the signal of a channel. Thus, where there are four channels, VGC_ch 289 may include four measured VGC voltages: VGC_1, VGC_2, VGC_3, and VGC_4.

VPKD ADC 235 monitors analog VPKD 222 and converts VPKD into a digital signal. VPKD ADC 235 may be operatively coupled to SPI registers PKD_ch 281, allowing a measured value of VPKD 222 to be communicated to the firmware 195. PKD_ch 281 may include four measured PKC voltages: VPKD_1, VPKD_2, VPKD_3, and VPKD_4.

In one or more embodiments, the SPI interface 180 of FIG. 1 may include the individual registers shown within the dashed line representing the SPI registers 280. The SPI registers 280 may communicate digital signals between the amplifier circuit 110 and the firmware 195. In one or more embodiments, the SPI registers 280 may communicate between AGC bandwidth controller 135 (depicted by a dotted line in FIG. 2) and the firmware 195.

A dither clock, Dither_CK, may be provided by dividing SPI digital clock, SPI_SCK, by a value in a clock subdivision N register 284 using the 1/N divider circuit 275. The digital clock may be supplied externally or available internally as a free-running digital clock. The dither clock, binary Dither_Enable 285, and Delta_VREF_ch 283 may be multiplied in multiplier circuit 265, where the product may be provided as a dither input to dither summation circuit 255. In the dither summation circuit 255, the dither input may be combined with the output from SPI register VREF_ch 282. In one or more embodiments, the dither input is added digitally. In a coherent receiver, Delta_VREF_ch 283 may include voltages Delta_VREF_1, Delta_VREF_2, Delta_VREF_3, and Delta_VREF_4; and similarly, VREF_ch 282 may include voltages VREF_1, VREF_2, VREF_3, and VREF_4.

The output from the dither summation circuit 255 may be passed through VREF DAC 245 to provide an input, VREF 223, into VGC summation circuit 230 along with inverted VPKD 222. The output of VGC summation circuit 230, error 224, may pass through loop filter 225 before providing the gain control voltage VGC 226 to the amplifier 215.

In one or more embodiments, the VGC_DDA0 and VGC_DDA1 engines 292 may be operatively coupled to the dither clock, Dither_CK and SPI registers Dither_Enable 285, DDA_length_K 286, DAC_DDA0_ch 287 and DAC_DDA1_ch 288. In a coherent receiver, DAC_DDA0 ch may include voltages DAC_DDA0_1, DAC_DDA0_2, DAC_DDA0_3, and DAC_DDA0_4; and DAC_DDA1_ch may include voltages DAC_DDA1_1, DAC_DDA1_2, DAC_DDA1_3, and DAC_DDA1_4. The VGC_DDA0 engine 292 may be configured to compute the average VGC 226 voltage sampled by the ADC 295 when the dither tone is low (logic-0). Similarly, the VGC_DDA1 engine 292 may be configured to compute the average VGC 226 voltage sampled by the ADC 295 when the dither tone is high (logic-1). DDA_length_K is the number of cycles the dither tone toggles 1 and 0 between Dither_Enable 285 start and stop. For example, for DDA_length_K=50, there are fifty 0-state and fifty 1-state in one dither DDA capture sequence. In one or more embodiments, the AGC bandwidth controller 135 may itself determine the number of cycles the dither tone toggles 1 and 0 between Dither_Enable 285 start and stop.

In one or more embodiments, the duration of Dither_Enable=1 may be set by the firmware 195. The duration may be in the range of 1 to 2 sec, though other durations may be selected without departing from embodiments disclosed herein.

Both the VGC_DDA0 and the VGC_DDA1 engines 292 may be reset when a 0-to-1 transition is detected on Dither_Enable 285. Both the VGC_DDA0 and the VGC_DDA1 engines 292 may stop averaging when a 1-to-0 transition is detected on Dither_Enable 285.

Figure 3:
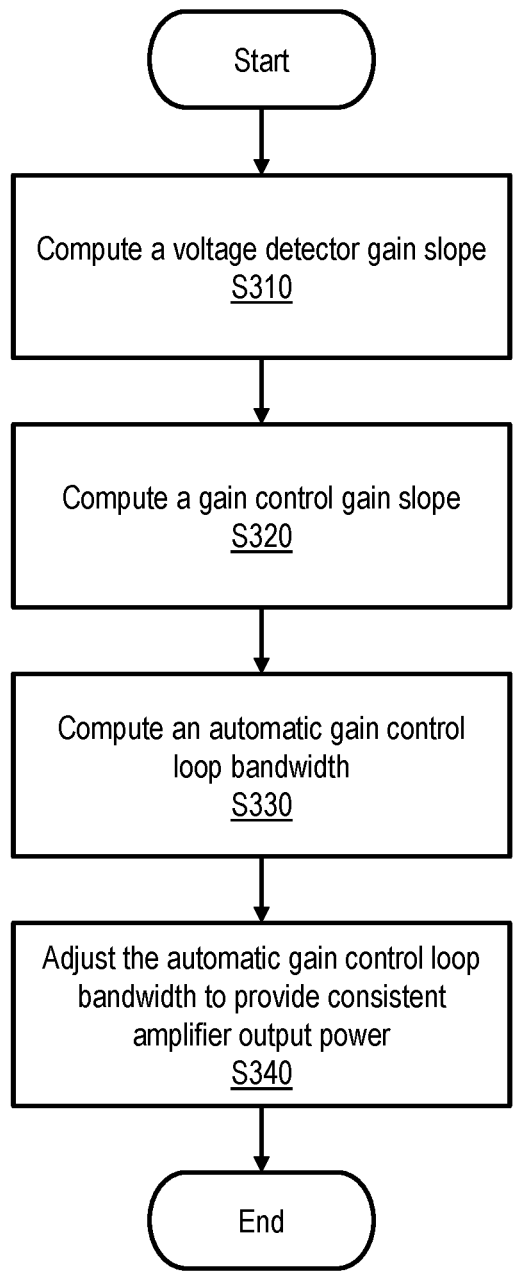
FIG. 3 presents a flowchart in accordance with one or more embodiments of the present disclosure.

One or more embodiments of the present disclosure may provide a method for AGC bandwidth discovery and control. FIG. 3 presents a flowchart in accordance with one or more embodiments of the present disclosure. While the various steps in this flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively. In addition, the steps may be repeated as required or desired.

Referring to FIG. 3, the method may include computing a first gain slope of a voltage detector 220 that measures the output voltage 203 of an amplifier 215 (Step S310). In an embodiment, the detector may be a peak voltage detector that outputs a peak voltage, VPKD.

Initially, Step S310 may include setting a dither-enable switch, Dither_Enable 285 to 0 to disable inserting a dither tone into VREF 223. In addition, S310 may also involve determining the target VREF value 223 sufficient to achieve the ADC 150 target input based on the digital power detector 170 reading after the ADC 150. This first VREF value is recorded as VREF0. As an example, VREF0 may be 1 volt. Subsequently, the VPKD value 222 is read from the PDK SPI register, PKD_ch 281, and this value is recorded as VPKD0.

Continuing with S310, the VREF value sufficient to achieve a second power output for the ADC is determined. In one or more embodiments, to determine this, a power 0.1 dB greater than in the previous measurement is selected. In other words 0.1 dB+target power is used and this second VREF value as is recorded as VREF_1. The VPKD value is then read from the PDK SPI register 281 and this value is recorded as VPKD1.

The PKD gain slope may then be computed by the difference in the VREF0 and VREF1 values, according to Eqn. (2):

$$K_{PKD} = \frac{VPKD1 - VPKD0}{0.1} \left(\frac{V}{dB}\right) \qquad (2)$$

Continuing with FIG. 3, the method next computes a gain slope of the amplifier gain control VGC 226 (Step S320). In one or more embodiments, Step S320 may include setting the VREF register, VREF_ch 282, to VREF0 and setting a Delta_VREF register 283 to (VREF1−VREF0). The Delta_VREF register 283 sets the dither amplitude, in this example 0.1 dB, above the VREF register 282 value.

A dither clock (Dither_CK) may be generated from an SPI clock (SPI_SCK) divided by the value N in clock subdivision N register 284. For example, if SPI_SCK=50 MHz and the desired Dither_CK is 50 Hz, then N=1×106. The product (Delta_VREF*Dither_CK*Dither_Enable 285) may be applied to the input of VREF DAC 245. The Dither_Enable 285 input may enable (Dither_Enable=1) or disable (Dither_Enable=0) the dither tone insertion function.

When the firmware 195 sets Dither_Enable=1 via the SPI register Dither_Enable 285, the product (Delta_VREF*Dither_CK) may be added to the value in the VREF register, VREF_ch 282. The input to the VREF DAC 245 may now toggle between values VREF0 and VREF0+Delta_VREF. For example, the dither clock may be set to 50 Hz. If a square-wave dither tone were enabled for 1 sec, then 50 data points in the 0-state and 50 data points in the 1-state could be sampled.

The VGC 226 may respond to the dither tone on VREF. In one or more embodiments, the VGC_DDA0 engine 292 computes the average VGC 226 voltage sampled by the ADC 295 when the dither tone is low (logic-0). Similarly, the VGC_DDA1 engine 292 may compute the average VGC 226 voltage sampled by the ADC 295 when the dither tone is high (logic-1).

In one or more embodiments, the duration of Dither_Enable=1 is set by the firmware 195. The duration may be in the range of 1 to 2 sec, though other durations may be selected.

Both the VGC_DDA0 and the VGC_DDA1 engines 292 may be reset when a 0-to-1 transition is detected on Dither_Enable 285. Both the VGC_DDA0 and the VGC_DDA1 engines 292 may stop averaging when a 1-to-0 transition is detected on Dither_Enable 285. The VGC_DDA0 and the VGC_DDA1 engines 292 may pass results to the firmware 195 via SPI registers DAC_DDA0_ch 287 and DAC_DDA1_ch 288, respectively.

The gain slope of amplifier gain control voltage, VGC 226, may be calculated by Eq. (3):

$$K_{GC} = \frac{0.1}{\text{VGC\_DDA1} - \text{VGC\_DDA0}} \left(\frac{dB}{V}\right) \quad (3)$$

In Step S330, the amplifier gain control loop bandwidth may be calculated according to Eqn. (1) above.

In Step S340, the AGC loop bandwidth may be adjusted to match the target bandwidth and provide consistent amplifier output power. For example, SPI register LFADJ_ch 290 may provide an LF_Adj signal to loop filter 225 via LFADJ DAC 298. In a coherent receiver, LFADJ_ch 290 may include voltages LFADJ_1, LFADJ_2, LFADJ_3, and LFADJ_4.

Those skilled in the art will appreciate that the integrated circuit on which the TIA and receiver are implemented starts out with different bandwidths for each channel because in a coherent receiver the gain control slopes for each are different at start-up. Using embodiments disclosed herein, all channels may have matching bandwidths within approximately 10 seconds. Thereafter, bandwidth changes may occur due to temperature changes of the chip, and the process of FIG. 3 above may be repeated when such temperature changes affect the bandwidth of one or more channels. In one or more embodiments, bandwidths of all channels are within 10% of each other. For example, if the AGC is 30 KHz, the target for all channels may be between 27-33 KHz.

Figure 4A:
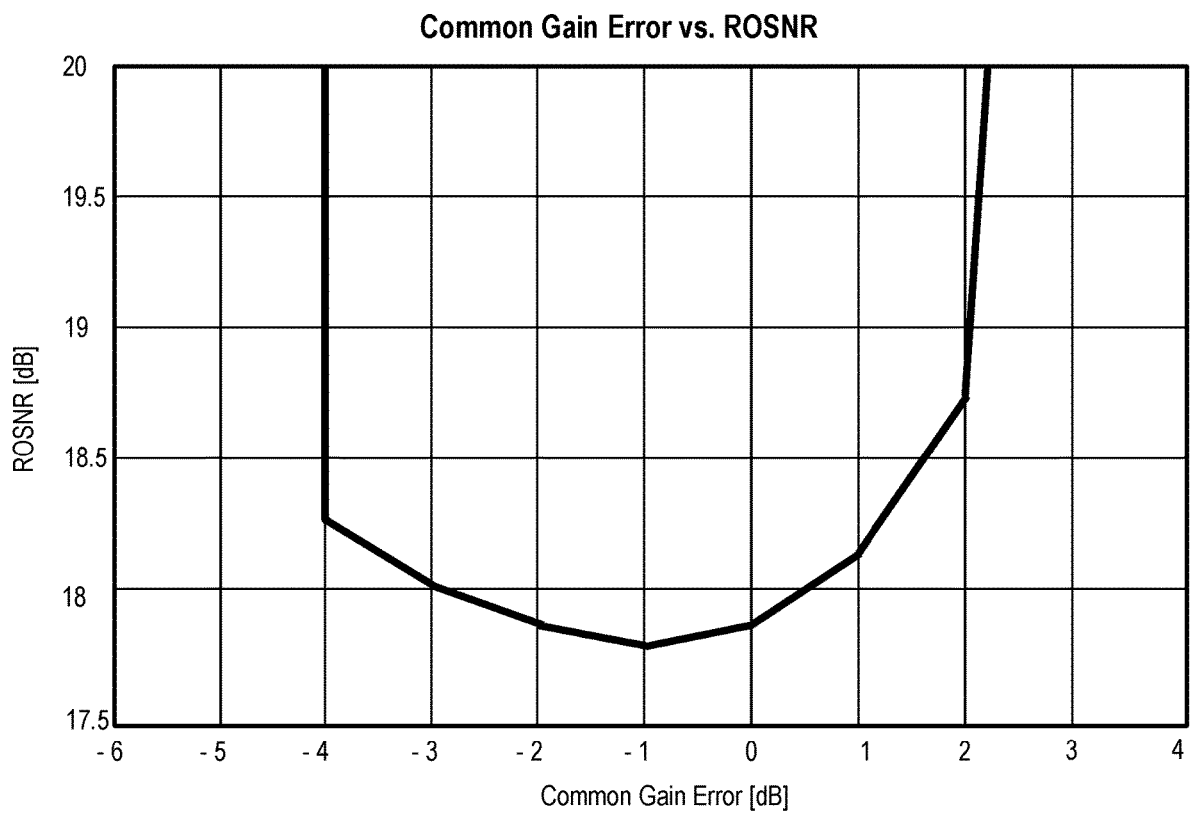
FIGS. 4A and 4B show common-mode gain error and differential-mode gain error, respectively, as a function of required optical signal-to-noise ratio (ROSNR) in accordance with one or more embodiments of the present disclosure.
Figure 4B:
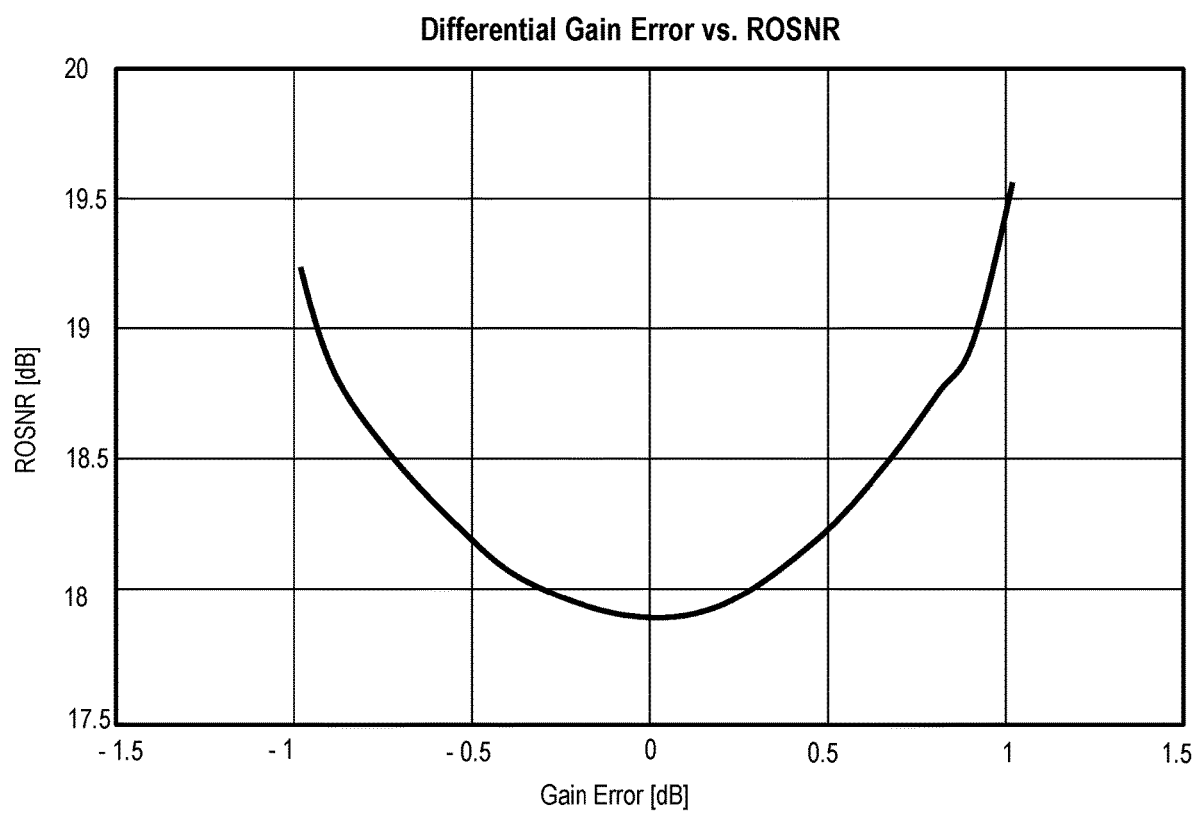

Particularly in a coherent receiver, an AGC loop bandwidth that is too slow may introduce common-mode ADC fill error on both I and Q axes $$\left(\frac{Error_1 + Error_0}{2}\right)$$

resulting in coherent receiver performance impairment, e.g., a required optical signal-to-noise ratio (ROSNR) penalty. An AGC loop bandwidth that is too fast may introduce differential-mode ADC fill error between the I and Q axes $$\left(\frac{Error_1 + Error_0}{2}\right),$$

which also impairs coherent receiver performance. An unmatched AGC loop bandwidth between the I and Q axes may introduce differential-mode ADC fill error as well. Examples of common-mode gain error and differential-mode gain error as functions of ROSNR are shown in FIGS. 4A and 4B, respectively. The range for the common-mode gain error is ±1.0 $dB_{Peak}$ and for differential-mode gain error is ±0.1 $dB_{Peak}$. Therefore, a known and stable AGC loop bandwidth may be important to coherent receiver performance.

The coherent optical receiver's AGC loop may provide a constant signal amplitude at the input of the ADC 150. The latency and the bandwidth of the AGC loop may be designed so that the AGC loop can track optical power transients that appear in an optical link with a certain tolerable ADC fill error.

In one or more embodiments, the AGC loop described herein is an analog AGC loop. An analog AGC loop may provide a smaller form factor than a digital AGC loop because a digital AGC loop may require four external high-speed DACs (e.g., >2.5 MSamples/sec) and four high-bandwidth buffers to drive the amplifier gain control input (VGC). The high DAC update rate and high VGC analog bandwidth may be required to achieve low digital AGC loop latency. In addition, a digital AGC loop may require a large number of interconnects between the DSP-to-TIA chips and multiple external components that may limit integration of components and introduce noise. Integrating a high-speed DAC into a DSP chip may not provide suitable fidelity and speed. In addition, four external buffers may still be required. Further, one or more embodiments of the present disclosure may allow greater ability for control of the AGC loop bandwidth than a device that uses an integrated or an external capacitor to set the loop bandwidth.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims

What is claimed is:

1. A coherent optical modem comprising:
   one or more inputs;
   one or more amplifier circuits, each coupled to a respective input of the one or more inputs; and
   one or more receiver circuits each including an analog-to-digital converter, each coupled to a respective amplifier circuit of the one or more amplifier circuits;
   wherein each of the one or more amplifier circuits is configured to implement an automatic gain control loop to provide a constant signal amplitude at an input of the analog-to-digital converter of a respective receiver circuit; and
   wherein the automatic gain control loop of each of the one or more amplifier circuits receives feedback from a digital power detector in the respective receiver circuit.

2. The coherent optical modem of claim 1, wherein the coherent optical modem is pluggable.

3. The coherent optical modem of claim 1, wherein the one or more inputs, the one or more amplifier circuits, and the one or more receiver circuits each include more than one, and wherein the automatic gain control loop is coordinated across multiple channels.

4. The coherent optical modem of claim 1, wherein the automatic gain control loop of each of the one or more amplifier circuits tracks optical power transients on an optical link.

5. The coherent optical modem of claim 1, wherein the automatic gain control loop of each of the one or more amplifier circuits includes monitoring output voltage and amplifier gain control voltage, to generate feedback to control the amplifier gain control voltage.

6. The coherent optical modem of claim 5, wherein the feedback to control the amplifier gain control voltage is via a dither tone.

7. The coherent optical modem of claim 1, wherein the automatic gain control loop of each of the one or more amplifier circuits includes a bandwidth controller configured to adjust a loop filter.

8. The coherent optical modem of claim 1, wherein the automatic gain control loop of each of the one or more amplifier circuits is analog.

9. The coherent optical modem of claim 1, wherein the automatic gain control loop of each of the one or more amplifier circuits is digital.

10. A method comprising:
providing a coherent optical modem comprising
one or more inputs;
one or more amplifier circuits, each coupled to a respective input of the one or more inputs; and
one or more receiver circuits each including an analog-to-digital converter, each coupled to a respective amplifier circuit of the one or more amplifier circuits;
wherein each of the one or more amplifier circuits is configured to implement an automatic gain control loop to provide a constant signal amplitude at an input of the analog-to-digital converter of a respective receiver circuit; and
wherein the automatic gain control loop of each of the one or more amplifier circuits receives feedback from a digital power detector in the respective receiver circuit.

11. The method of claim 10, wherein the coherent optical modem is pluggable.

12. The method of claim 10, wherein the one or more inputs, the one or more amplifier circuits, and the one or more receiver circuits each include more than one, and wherein the automatic gain control loop is coordinated across multiple channels.

13. The method of claim 10, wherein the automatic gain control loop of each of the one or more amplifier circuits tracks optical power transients on an optical link.

14. The method of claim 10, wherein the automatic gain control loop of each of the one or more amplifier circuits includes monitoring output voltage and amplifier gain control voltage, to generate feedback to control the amplifier gain control voltage.

15. The method of claim 14, wherein the feedback to control the amplifier gain control voltage is via a dither tone.

16. The method of claim 10, wherein the automatic gain control loop of each of the one or more amplifier circuits includes a bandwidth controller configured to adjust a loop filter.

17. A pluggable coherent optical modem comprising:
a plurality of inputs including multiple channels;
a plurality of amplifier circuits, each coupled to a respective input of the plurality of inputs; and
a plurality of receiver circuits each including an analog-to-digital converter, each coupled to a respective amplifier circuit of the plurality of amplifier circuits;
wherein each of the plurality of amplifier circuits is configured to implement an automatic gain control loop to provide a constant signal amplitude at an input of the analog-to-digital converter of a respective receiver circuit,
wherein the automatic gain control loop of each of the plurality of amplifier circuits is configured to receive feedback from a digital power detector in the respective receiver circuit, and
wherein the automatic gain control loop is coordinated across multiple channels.

18. The pluggable coherent optical modem of claim 17, wherein the automatic gain control loop of each of the plurality of amplifier circuits tracks optical power transients on an optical link.

* * * * *